United States Patent [19]

Phillips et al.

[11] Patent Number: 4,646,003
[45] Date of Patent: Feb. 24, 1987

[54] METER TESTING DEVICE

[75] Inventors: Charles E. Phillips, Alhambra; Alan M. Hood, San Dimas, both of Calif.

[73] Assignee: Southern California Edison Company, Inc., Rosemead, Calif.

[21] Appl. No.: 693,811

[22] Filed: Jan. 18, 1985

Related U.S. Application Data

[63] Continuation of Ser. No. 354,149, Mar. 5, 1982, abandoned.

[51] Int. Cl.$^4$ ............................................. G01R 35/04
[52] U.S. Cl. ........................................ 324/74; 364/571
[58] Field of Search ..................... 324/74, 130, 142; 364/571

[56] References Cited

U.S. PATENT DOCUMENTS

| | | | |
|---|---|---|---|
| 1,942,258 | 1/1934 | Rutter et al. | 324/74 |
| 2,249,075 | 7/1941 | Young et al. | 324/74 |
| 2,938,165 | 5/1960 | Greig | 324/74 |
| 3,900,794 | 8/1975 | Bell | 324/142 |
| 4,271,390 | 6/1981 | Canu | 324/74 |

OTHER PUBLICATIONS

Custom Terminals Corp. (Accu-Ver).
E. J. Brooks Company (Apr. 1, 1980) Ekstrom.
System Jett of North Carolina (Calibration Checker Model SJ621).
H. J. Arnett Industries, Inc. (The Average Beast).

Primary Examiner—Ernest F. Karlsen
Attorney, Agent, or Firm—Lyon & Lyon

[57] ABSTRACT

An apparatus and method for verifying the accuracy of watt-hour meters at their operational site includes applying a phantom load to the meter and to a watt transducer. The relative watt hour readings of the meter are compared to the watt hours computed from the power to the watt transducer and represented as a percentage error of the meter. The phantom load is constituted by a loading transformer with optional load adjustments to take into account different loads to the meter and there are also adjustment means to take into consideration different meter characteristics. The meter watt hour reading is determined from an articulated light generating and receiving means mounted in alignment with the revolving disc so that light passes through the aperture in the disc to the receiving means and then signals the verifying apparatus to give an indication of the watt hour reading of the meter. Alternatively the reading is obtained manually.

14 Claims, 4 Drawing Figures

METER TESTING DEVICE

This application is a continuation of application Ser. No. 354,149, filed 3/5/82 now abandoned.

BACKGROUND OF THE INVENTION

This invention relates to a meter testing device, particularly an electric watt-hour meter. The invention is particularly concerned with verifying the operational accuracy of such watt-hour meters.

Electricity supply companies are often requested by users of electrical power to ascertain and prove the accuracy of the watt-hour meter which reads the amount of electricity being consumed by the custumer. To satisfy such customers the utility companies send a skilled testman to the operational site and through fairly complex operational techniques the meter accuracy is tested. It is recognized that the accuracy of the meter is within a standard of error of 2%, and in the event of the meter being inaccurate to a degree greater than this, then procedures have to be followed at the operational site to have the meter rectified.

At manufacturing and laboratory locations electric watt-hour meter testing and calibration require skilled, technical operators who operate highly sophisticated and complex equipment, and it is clearly not feasible to use such equipment at different operational sites.

Inherently, therefore, it is desirable to provide a watt-hour meter testing apparatus and a method for testing such meters which is relatively simple by nature, so that verification at the operational site can be made by relatively unskilled testmen or meter readers. At the same time the testing apparatus should be able to provide the user at the operational site with simple verifiable evidence as to the accuracy or otherwise of the meter under test. None of this is to date possible with the known meter testers and methods of determining accuracy.

In U.S. Pat. No. 4,271,390 (Canu), there is disclosed a meter testing device wherein an adapter is inserted into a meter receiving socket and the meter under test is then fitted into the adapter. With the adapter are means for measuring the volts or wattage passing through a known load in the form of a standard light bulb connected to the adapter, the voltage and wattage being displayed. A comparison therefore of the displayed wattage relative to the bulb's rated power characteristics is the indication of the accuracy of the meter. With this device, however, the power supply lines are isolated from the normal operational load and this leads to inconvenience at the operational site. Additionally the load in the form of a standard light bulb is relatively very low compared to the normal operational load and thus read by the meter. Thus the degree of accuracy obtained by this prior art device is not representative of normal conditions and is thus relatively poor.

In U.S. Pat. No. 2,249,075 (Young), there is disclosed an adapter which can be interposed between a meter socket and a meter and to which a suitable measuring instrument can be connected. This device however does not indicate that the device could be used for loading the meter in any way and/or obtaining a verification of the meter.

In U.S. Pat. No. 2,938,165 (Greig), there is disclosed the standard method for testing meters in a laboratory whereby a standard meter and a meter under test are effectively connected with a loading transformer with different loading situations. This complex testing procedure requires two meters: the standard meter puts out pulses according to the revolutions of the meter disc, and the meter under test likewise puts out pulses according to light passing through an aperture of its revolving disc. The relative pulse counts are compared and a reading of accuracy is obtained in the form of indicating the percentage registration of the meter under test. The test disclosed in this patent requires that the speed ratios of the standard meter and tested meter are the same. Accordingly, different standard meters are required to test different meters being verified. The application of the disclosed test is therefore limited to specific apparatus. The photo pickup which is used to pass light through the appurture in the meter under test is suitable for operation under laboratory conditions. However, this photo pickup method has never been found applicable in practice in the prior art for use at outdoor operational sites since there are ambient light conditions which impact greatly on the light between the generating source and receiving means thereby affecting the signal picked up by the receiver. Consequently, to date it has been necessary to count revolutions of the disc in the field simply by visibly detecting a black mark on the outer perimeter of the disc and physically counting the number of revolutions by counting the number of times that the dot passes. This is susceptible to inaccuracies.

A sample of prior art known for calibrating a watt-hour meter in a laboratory exists in U.S. Pat. No. 3,409,829 (Elmore), where there is disclosed a computer controlled callibration test rack and from which it is clear that laboratory testing of meters is complex and not amenable to use in operational sites by relatively skilled testmen.

U.S. Pat. Nos. 4,120,031 (Kincheloe), 4,133,034 (Etter), 4,224,671 (Sugiyama), 4,240,149 (Fletcher), and 4,283,772 (Johnston) disclose various forms of electronically monitoring and calculating characteristics associated with power usage through watt-hour meters.

In the commercial field, E. J. Brooks Company of Michigan markets a meter evaluator under the trade name EKSTROM wherein the evaluator places a high load on the meter and a fixed number of revolutions of the meter disc is timed. Calculations are then made by inserting the time interval into a percentage registration formula and then determining the percentage of registration of the meter. The load applied to the meter is in the form of two hair drier type motors and heating coils, and thus this is a noisy test device and heavy on its loading requirements, thus producing excessive heat.

Another commercially available system is that produced by System Jett of North Carolina who provide a Calibration Checker, model SJ621, which requires inserting an adaptor with a standard meter and a meter under test into the meter receiving socket. Simultaneously electronically comparing the readings through the meters are obtained such that the kilowatt hours of each meter are obtained, and also the percentage registration of the meter under test is ascertained.

In the tester known commercially as the "The Average Beast", H. J. Arnett Industries, Inc. of Portland, Ore. places an adaptor into the meter socket and then puts the meter into the adaptor. After timing a predetermined number of disc revolutions, readings are compared against a tabulated set of figures to ascertain the percent registration of the meter. In the application of this verifier the power between the line and operational load is broken, and additionally the disadvantage of manual calculation is necessary.

In yet a further commercial device, the ACCU-VER verifier marketed by Custom Terminals Corp. of Hauppange, New York locates an adaptor between the meter receiving socket and the meter and then applies a test with a known load to the meter. Thereafter after timing the meter disc for one or more revolutions, there is obtained a rough accuracy check.

None of the cited art however provides for meter verification which is simple to apply by non-skilled personnel at an operational site, nor does any apply a representative real load to the meter such that verification under normal operating conditions can be obtained.

Furthermore, the prior art does not disclose of an effective light generating and receiving means which is operational with a rotating disc of the meter whereby accurate determinations of the watt-hours in the meter can be made at the operational site. Also non-existent in the prior art is the means of calculating the percentage error of the meter under test under the representative real load conditions, and displaying such representative error as a percentage.

SUMMARY OF THE INVENTION

There is provided apparatus and a method for testing watt-hour meter accuracy at its operational site by locating an adaptor in the meter receiving socket and in turn placing meter in electrical contact with the adaptor. A phantom load is then applied to the meter under test and also to a watt-transducer. Thereafter the actual watt-hours determined by the watt-transducer for a predetermined number of disc revolutions is compared relative to the watt-hours indicated by the meter to compute digitally the percentage error of the meter.

The revolutions of the meter disc are determined by a light passing from a light generating source through a disc aperture when such aperture is aligned with the source and receiving means located on the opposite sides of the disc.

DETAILED DESCRIPTION

Figure 1:
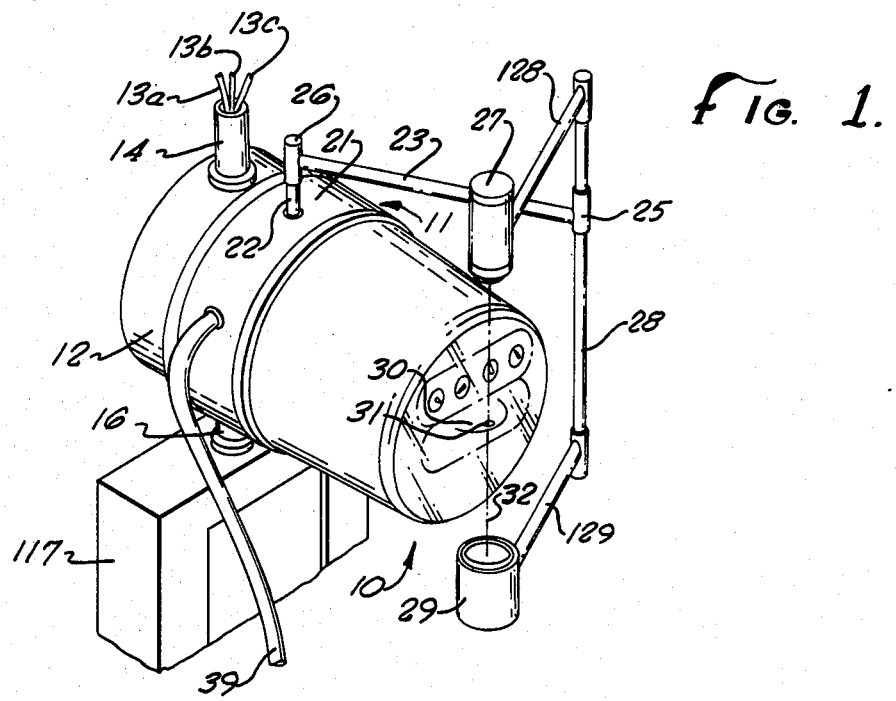
FIG. 1 is an isometric view of the meter receiving socket together with an adaptor and the meter fitted on the adaptor, and showing electrical conductors from the adaptor.

Apparatus for testing the accuracy of a watt-hour meter 10 at its operational site includes an adapter 11 for location between the meter 10 and a meter receiving socket means 12. The power lines 13a, 13b, and 13c enter the meter receiving socket 12 through a conduit means 14 which communicates with the interior of the meter receiving socket 12. The load lines 15 leave the socket 12 through a conduit means 16 and enter a circuit breaker arrangement contained within circuit breaker box 117.

Figure 3:
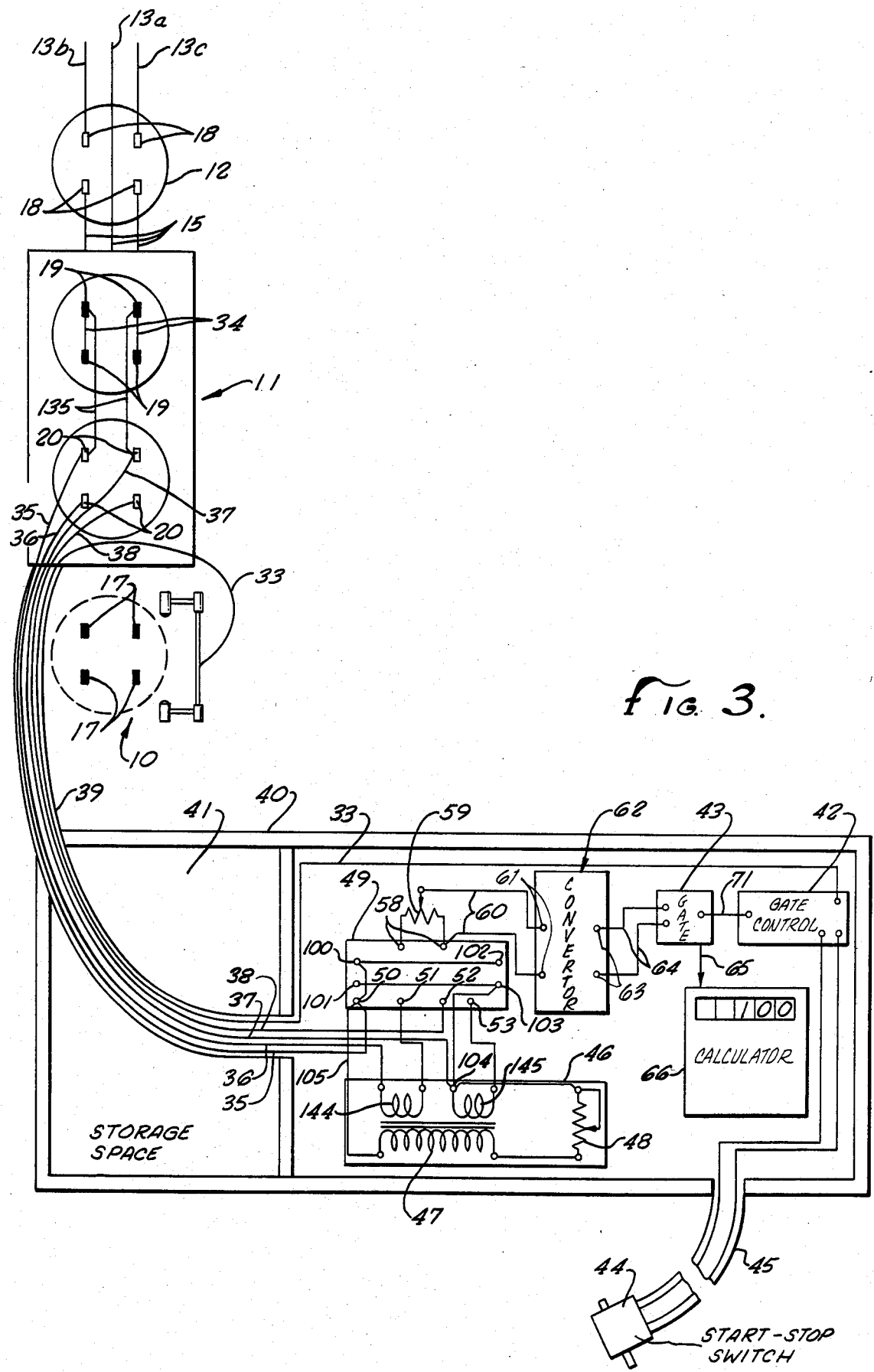
FIG. 3 is a schematic illustrating the connection of the loading transformer in the verifying apparatus to the adaptor and watt-transducer, the apparatus being shown in a carrying case.
Figure 4:
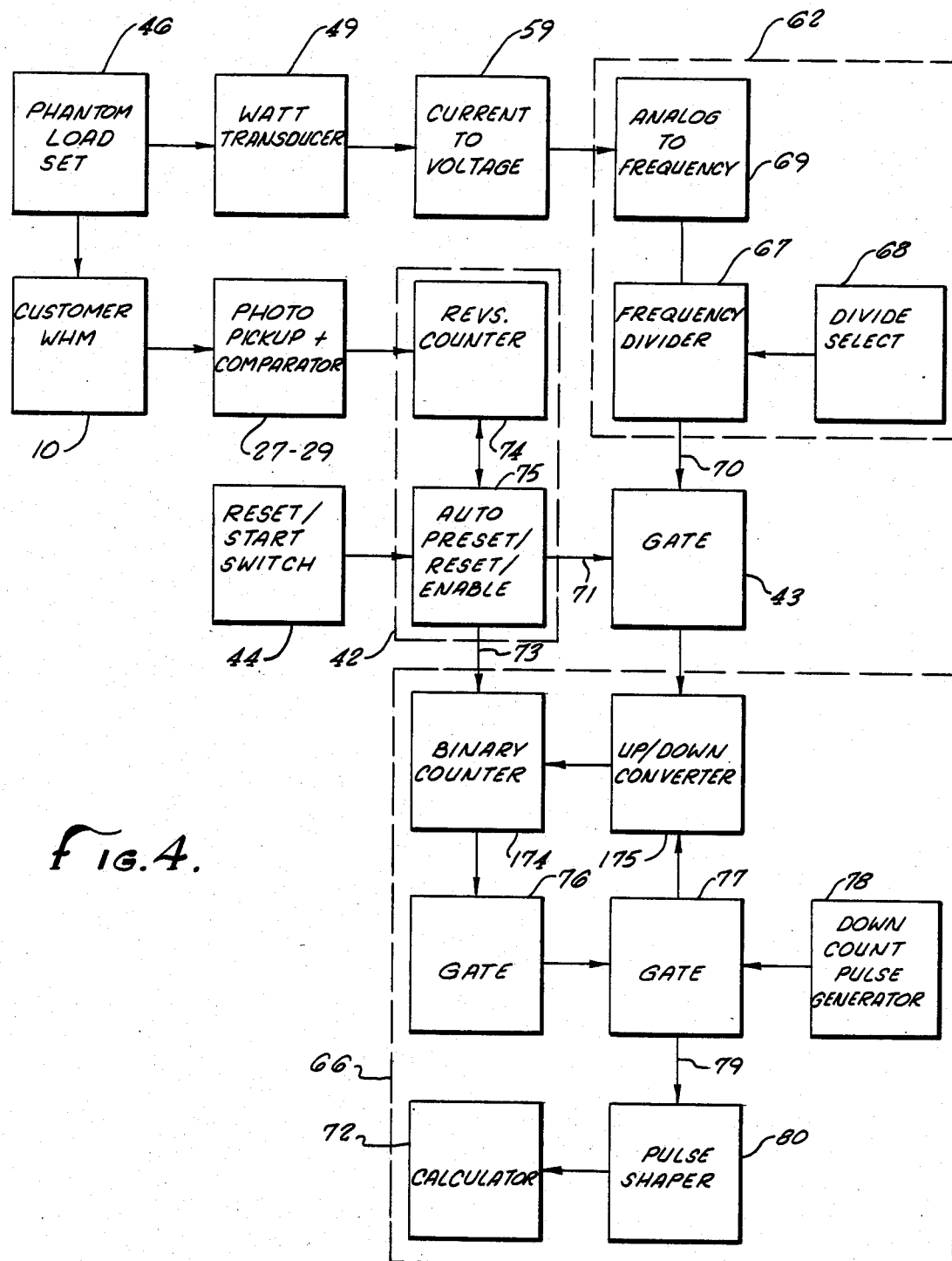
FIG. 4 is a block diagram of the schematic block diagram representing the manner in which signals obtained from the operational watt-hour meter and the watt-transducer are translated, compared and computed to obtain a reading of the percentage error of the meter.

The meter 10 is shown in phantom lines in FIG. 3 and it provides contact blades 17 which normally would fit within the terminal jaws 18 in the meter receiving socket 12. The adapter 11 provides at one end blades 19 which are adapted to fit into the jaws 18 of the meter receiving socket 12 and jaws 20 at its opposite end which are arranged to receive the blades 17 of the meter 10.

Mounted on the casing 21 of adapter 11 at its uppermost portion is a vertical conduit 22 which has an articulated arm arrangement consisting of a portion 23 which is pivoted about a pivot arrangement 25. The portion 23 is also pivoted with a coupling 26 on the vertical conduit 22. Hingedly mounted at the end of arm 23 is a vertical arm 28 which has two spaced apart horizontal limb 128 and 129. At the end of limb 128 is a light generating source 27 which is rigidly connected to limb 128, and at the end of limb 129 there is mounted a light receiving means 29 also rigidly connected to the limb 128 so that the generating source 27 and receiving means 29 face toward each other. With the articulated mechanism the generating source 27 and receiving means 29 can be located at the top and bottom of the meter 10 respectively so that a revolving disc 30 in the meter 10 is located between the generating source 27 and receiving means 29. In other embodiments the light receiving means 29 and light generating means 27 are in the opposite locations relative to the disc 30.

The revolving disc 30 includes an aperture 31 and with the disc 30 revolving in a horizontal plane light from the generating source 27 can pass axially as indicated by line 32 to the receiving means 29 through the apperture 31 when such apperture 31 is aligned along the axial line 32. With the disc 30 in a different position of its revolution the light is interupted. Within the articulated arm structure 22, 23, 28, 128 and 129 there is contained a cable 33 which passes a signal from the receiving means 29 into the adapter 11 and in turn to other apparatus of the verifier. The cable 33 also contains wires to the light generating source 27 and light receiving means 29.

The light generating source 27 is a high intensity quartz-halogen light with a lens concentrating system and the receiving means 29 has a lens arrangement for receiving light from the generating source 27. In view of the verifier operating for relatively short time periods for each verification it has been found that the high heat which would normally be generated by the high intensity light source 27 does not in fact occur and the apparatus does not rise to a temperature which would be a drawback to effective operation. Hence for the first time it is now possible to employ an effective light means in the field at operational sites to count disc revolutions.

The line supply is a three conductor conduit wire system, line 13a being a grounded wire and lines 13b and 13c carrying voltages of 120 volts each respectively. In the adapter 11, blades 19 are connected by conductors 34 so that power can pass to the electrical load terminals and thus power at 120 volts and 240 volts is continually supplied to the customer load 82 at the operational site. The power to the adapter is at 240 volts passing along conductor lines 135 which are connected with the top terminal jaws 20 of the adaptor 11 as indicated. The jaws 20 respectively connect with the mating blades 17 on the meter 10 and in this fashion the meter is supplied with power at 240 volts.

Conductor lines 35, 36, 37 and 38 are connected with the jaws 20 of the adapter 11 and pass through the adaptor housing in a cable sheath 39 together with the cable 33 from the light generating 27 and receiving means 29. The cable 39 enters a storage box or case 40 which has a compartment 41 for storing the adapter 11 and articulated arm mechanism when not in use.

Cable 33 is connected with a gate control means 42 which operates gate 43. The gate control means 42 is connected with a stop-start hand switch 44 by means of lines 45.

Lines 35, 36, 37 and 38 which are connected to the terminals 20 of the adapter 11 are connected to the loading transformer 46 which provides a phantom load to the meter 10. The loading trnsformer 46 includes a pair of coils 144 and 145 which form the one side of the transformer and the second side of loading transformer 46 is constituted by winding 47. There is also included a load adjustment resistor 48 in the circuit of the winding 47 of the second winding 47 of loading transformer 46 whereby the phantom load on the meter 10 can be varied. Alternatively a variable voltage transformer such as a Variac (TM) can functionally replace variable resistor 48.

The lines 35, 36, 37 and 38 are connected to the load transformer 46 through connection with terminals 50, 51, 52 and 53 of a watt transducer 49. In this embodiment the watt transducer is a 3 phase, 2-element transducer; however, in alternative arrangement a single element transducer could be used with an appropriate transformer. The selected transducer requires isolation between the two power legs originating from lines 13b and 13c. The isolation is shown between terminals 50 and 51 on the one hand, and terminals 52 and 53 on the other hand. By this connection, the phantom load is also applied to the watt-tranducer 49.

The output of the watt transducer 49 is a signal which is a milliamp current proportional to the wattage derived from the current terminals 50, 51, 52 and 53 and the voltage on terminals 101 and 102. Terminals 100 and 102 of the watt transducer 49 are connected together, and terminals 101 and 103 of the watt transducer are also connected together. These terminals 100, 101 are voltage inputs to the watt transducer 49 corresponding to the current inputs 50 and 51, terminal 50 being connected to terminal 100 so to apply the voltage from being connected to terminal 100 so to apply the voltage from line 13b. Terminals 102 and 103 are voltage inputs corresponding to the current inputs 52 and 53, terminal 103 to terminal 104 so to apply a voltage from line 13c.

There is connected across the output terminals 58 a potentiometer 59 which translates the current value to a voltage value across lines 60 which is then porportional to the wattage across the watt-transducer 49. The potentiometer 59 also permits calibration of transducer 49 as required.

Figure 2:
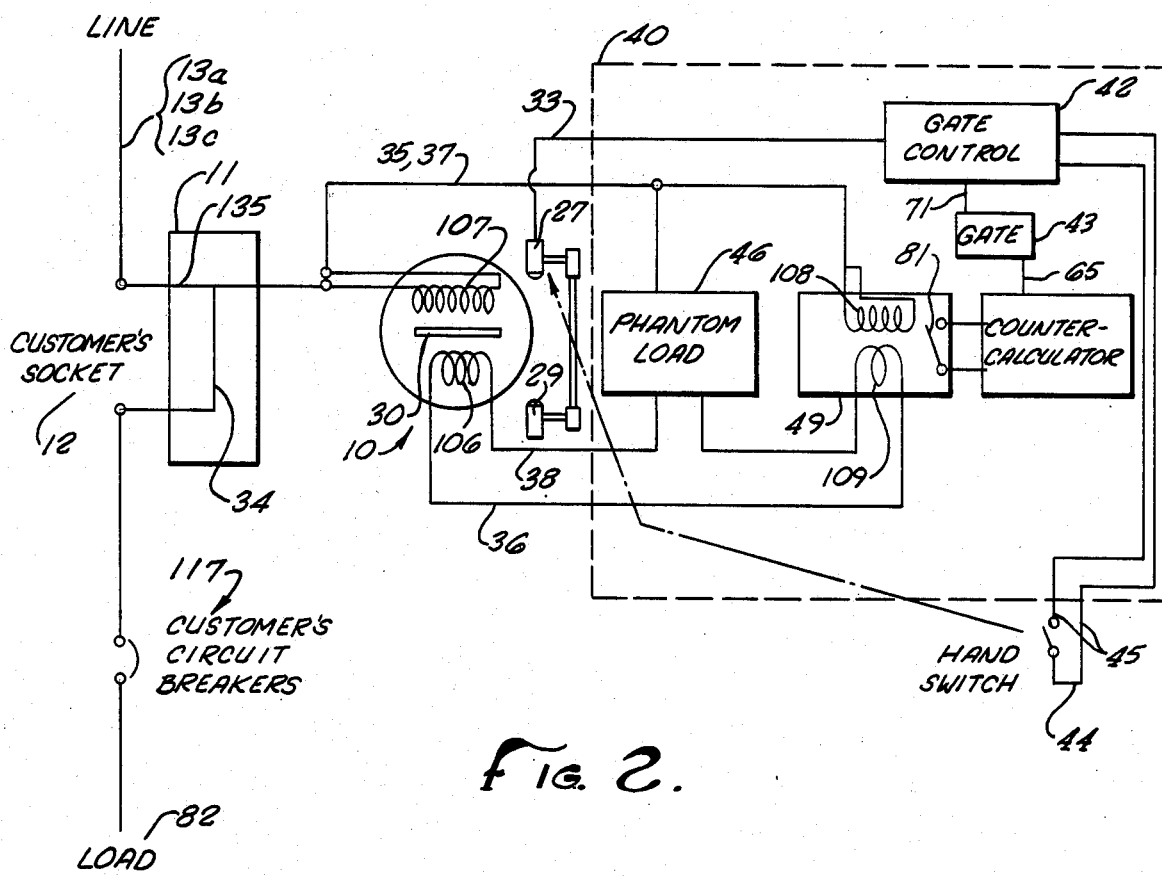
FIG. 2 is a block diagram-schematic of the meter accuracy apparatus in connection with the supply lines.

In the block-diagram schematic of FIG. 2, there is only shown illustrating a single current coil 106 in the meter 10, whereas there is in practice two such coils 106. There is also shown a single voltage coil 107, and in practice there is only such a single coil 107. In this FIG. 2, lines 35 and 37 are shown connected to both the phantom load 46 and watt transducer 49, through coil 108. The coil 108 is also illustrative of one of the two coils 108 which exist in practice. One of which coils 108 would be connected to terminals 100 and 101, on the one hand, and the other of coils 108 would be connected to terminals 102 and 103, on the other hand. In FIG. 2 the coil 109 in the watt transducer 49 is also illustrative of two coils 109 which would exist in practice; one of which could be connected across terminals 50 and 51, and the other across terminals 52 and 53 respectively. One of the coils 109 is connected to coil 106 through conductors 36 and 38. In this Figure the second coil 109 (not shown) is connected through conductors 35 and 37 (not shown, in this sense) with the second coil 106 (not shown) in the meter 10. However this connection would follow a similar path to that shown for conductors 36 and 38 in FIG. 2, and these conductors, connections and coils have been omitted solely in the interests of understanding the FIG. 2. To anyone skilled in this art these connections would be clearly apparent in view of what has been described and illustrated. In FIG. 2 the phantom load is only illustratively indicated, and the details with both the coils are shown and described in FIG. 3 as coils 144 and 145. One of each of the coils 144 and 145 are connected in series with the coils across terminals 50 and 51; and 52 and 53 respectively of the watt transducer 49, and, in this manner, the conductors 36 and 38 are connected to the coils 144 and 145.

With the lines 35, 37 from adapter 11 there is effectively connected across the primary winding 47 of loading transformer 46, a nominal 240 volt supply. Any difference from 240 volts could be dropped across the resistor 48. The connection of line 35 to the primary winding 47 passes through line 105, and the connection of line 37 passes through resistor 48 to the primary winding 47. Lines 36 and 38 complete the current circuit for the secondary side of loading transformer 46.

The lines 60 are connected to the input terminals 61 of an analog to digital converter 62 and the output terminals 63 of this converter 62 are connected by lines 64 to the gate 43. The output of the gate 43 is connected by lines 65 to a computing means constituted by counter-calculating means 66 to provide information representative of the accuracy of the meter 10.

The analog-digital converter 62 includes a frequency divider 67 and a divide-select 68 which allows the testing apparatus to be adjusted for the sensitivity of the particular meter 10 under test. In this connection each meter 10 has its own meter constant and this relates to the operational characteristics of the meter and also translates into the number of times that the disc 30 revolves relative to the consumption of kilowatt hours. Thus, a meter with a constant ($K_h$) of 7.2 would rotate 1 revolution per 7.2 watt hour. The divide-select 68 therefore permits variations of the meter chacteristic to be programmed into the system, such as, for example, between 7.2, 3.6, 2.0 and 1.0. In this fashion the calculation of watt hours in the analog-digital converter 62 and further into the calculator means 66 will be a comparative figure relative to the revolutions of the disc 30 as picked up by the light receiving means 29 and then related to the gate control circuit 42.

Also within the analog-digital converter 62 is an analog to frequency converter 69 which cooperates with the frequency divider so that the output from the analog-digital converter 62 as depicted on line 70 is a train of pulses having a frequency proportional to the watt transducer output. This is applied to the gate 43.

The hand operated switch 44 through the gate control means 42 enables the gate 43 by signals along the line 71, thus allowing the output from the converter 62 to be applied to the calculator means 66. The gate control 42 counts the number of pulses from the receiving means 29 and, once a predetermined number of pulses are received corresponding to a predetermined number of revolutions of the meter disc 30 disables the gate 43. In this manner the gate control means 42 enables the gate 43 for a number of watt hours corresponding to a predetermined number of turns of the rotating disc 30. A calculator 72 then digitally displays the percentage error of watt hour meter 10 as a result of the total number of pulses counted from the receiving means 29 and a comparison with the power measured by the watt transducer 29 as suitably converted.

The calculating means 66 is described with support circuitry to adapt a relatively inexpensive hand calculator 72 to be responsive to the pulses from line 73 as received from the revolution counter 74 and switch means 75 which either automatically operates the gate control means 42 or operates manually as determined by hand switch 44. The gate 43 determines the enablement of the calulator means 66. The circuitry of the calculator means 66 also adapts the pulses along line 73 to a signal which can be counted by calculator 72 which responds to a relatively slow input. This circuitry includes a binary counter 174, an up-down convertor 175, gate 76, and gate 77, which gate 77 is also fed by down-count pulse generator 78. The output from gate 77 along line 79 is to a pulse shaper 80 which then outputs to the calculator 72.

The down count pulse generator 78 of the support circuitry is a frequency generator operating at near the maximum operating frequency of the calculator input, and is enabled during memory down-count operation by the binary counter 174. The pulse shaper 80 provides a positive edge triggering pulse with a minimum pulse duration to trigger the calculator 72 in the manner described.

With the arrangement of the invention the calculator is arranged initially to display digitally "100" which represents 100% possible error when comparing the meter 10 watt-hour registration as against the watt transducer 49 watt-hour registration for the period of test. As the calculation process takes place in the calculating means 66 through the input of the down-count pulse generator 79 that sequentially subtracts a fractional error factor from the total possible error, the "100" digital display reduces to a final figure which would represent ultimate percentage error of the watt hour meter 10. Thus, if the final figure is 37 1.1", the percentage error is one and one-tenth percent plus. By the term "plus" it is meant that the watt hour meter is reading more than the true energy. If the reading is "negative" it would mean that the meter 10 is reading less energy than actually consumed.

When the term "accuracy" is used in this application it refers to either the percentage error, or the degree with which the meter shows the percent registration as a deviation from true energy through the meter. Thus a calculator reading of minus 2.1 would represent a percentage error of 2.1% negative; and in alternative embodiment if the calculator displays 102.1 this represents an error in the meter under test of 2.1% negative.

The support circuitry of the calculating means 66 can be replaced by micro-processors, and such a microprocessors could also include some of the other circuit elements contained within the analog-digital converter 62, gate 43 and gate control means 42. With microprocessors even more enhanced error readings can be obtained.

With the apparatus of the invention the adapter 11 allows the customer to continue using energy but at the same time isolates the meter 10 which is under test from service except for the 240 voltage power. Such energy which the customer would be using would not be metered.

The meter 10 under test is artificially or phantom loaded by the loading transformer 46 in that it sees an artificially high load, for instance, 3.6 kilowatt (15 amps×240 v). However, the test apparatus actually consumes only a small portion of this actual power. This permits the meter under test 10 to be verified at realistic operational type conditions.

The test apparatus employs a high quality solid state watt transducer 49 which "sees" the same phantom load as the meter 10 and this comparison between the watt-hour reading on the meter 10 and that obtained from the watt transducer 49 as suitably translated through the electronic circuitry provides the percentage error that is required in the verification.

The watt transducer output ultimately outputs, as the equivalent of a relay contact rate of closure depicted illustratively by relay 81, a signal which is accurately porportional to the kilowatt hours being introduced to the customer's meter. Repeated contact closures on illustrative relay 81 are summed in the calculator 66 taking account of the disc constant Kh of the customer's meter 10. In some embodiment relay 81 is a mechanical switch, whereas in the embodiments it can be solid state equivalent relay.

In use, the apparatus requires removing the meter 10 from the meter receiving socket 12, connecting the adapter 11 into the socket 12 and thereafter installing the meter 10 into the adapter 11. The apparatus is energized when plugged into the socket 12 and the meter disc 30 rotates. Optionally switch means can be used to insure energization only when required. The calculator means 66 is programmed for the value of the particular meter and, when using the manual operation mode, the start-stop test switch 44 is closed by hand when a black disc spot passes a particular reference point. The meter disc revolutions are counted for the prescribed number of revolutions, for instance, ten, and the switch 44 opened again manually when the black spot reappears signifying completion of the number of requisite revolutions. At the end of the test the calculator display starts counting down from a "100" towards "0" and stops at a figure representing the percentage error of the meter 10.

In the alternative automatic arrangement the switch 44 is replaced by the enabling gate control circuitry 42 the counting does not commence until the aperture 31 appears in alignment between the source generating means 27 and receiving means 29 so that a light signal is received by the receiving means 29. In this manner counting takes place automatically and there is less room for human error. After a predetermined number of revolutions the switch circuitry 75, stops the count automatically by directing gate 43 and the calculation of percentage error is effected.

Although the invention has been described with reference to a 240 voltage three wire single-phase system clearly it is also applicable to other wiring systems such as 120 volt two wire system. The differences in the meter constant ($K_h$) for such systems as applicable can also be entered into the electronic calculations of the system and thus the verifier is highly utile for simple operation at customer sites by unskilled operators.

Furthermore, although the percentage accuracy has been shown as counting downwardly from 100% error to a lower percentage error, it is clear that the display could be the opposite way and that the percentage accuracy can be depicted or a form of registration from zero upwardly to one hundred percent or more.

With the test apparatus it is easy for an unskilled operator to perform the requisite verification. After a meter has been tested and an error reading recorded, it is only necessary for the operator to simply reactivate the switch manually by switch 44 or through the auto switching means 75 and retest the meter again, and as often as necessary, to insure accurate verification.

Furthermore it is possible to simulate the different loading on the meter by having range settings as governed by resistor 48 whereby the phantom load presents an artificial drawing of current for high, medium and low load conditions, for instance, where the current is in the range of between 30 amps and 5 amps. Thus, where the phantom load is in the order of 60 watts there is artificially presented to the meter 10 and the watt transducer 49 a load where the current is 30 amps. The meter 10 and watt transducer 49 in this situation will "see" 7.2 kilowatts of power in a 240 volt three wire system.

There is thus, with this invention, provided a simple manner for digitially displaying meter error under realistic test conditions without energy waste, heat dissipation or noise problems, and at the same time retain the consumer power supply connection, which are all among the problems which arise in prior art systems.

The described embodiment has concerned a single phase unit; however, the invention is also applicable to multiphase meters. Phantom loads can be applied to each phase of the multiphase system and to watt transducers in each phase, and suitable means can be provided for determining the accuracy of such a meter.

It should also be apparent that even though the meter socket adapter is described in this embodiment for testing socket type watt hour meters, it would be equally applicable that with this invention the adapter can be replaced with clip type connectors so as to test watt hour meters with screw type terminals which are referred to in the industry as "A" base meters.

Although there has been shown and described the fundamental novel features of the invention as applied to preferred embodiments thereof, it will be understood that various omissions and substitutions and changes in the form and details of the invention illustrated and in their operation may be made by those skilled in the art without departing from the spirit and scope of the invention, which should be limited only as indicated by the scope and the claims appended hereto.

We claim:

1. A self-contained portable apparatus for testing the accuracy of watt-hour meter at its operational site, the meter having contacts for connection with electrical power line terminals, and having contacts for connection with electrical load terminals, the meter being adapted for connection with said terminals, comprising:
   a. a phantom load means, said phantom load means being adapted for connection with said electric power line terminals and said electric load terminals at the meter operatinal site, the phantom load means being a low load representative of a higher load and including a loading transformer;
   b. watt transducer means electrically connected with said loading transformer whereby the loading transformer generates a prescribed current to the meter and the watt transducer, thereby simulating a higher watt load than actually applied to said transducer and meter; and
   c. calculating means for comparing over a time period, the watt-hours from the phantom load means through the watt transducer relative to the watt-hours from the phantom load means through the meter for providing information representative of the accuracy of the meter, said information being obtained from said calculating means.

2. Apparatus as claimed in claim 1 including gate control means adapted to enable gate means for a time corresponding to a predetermined number of turns of a rotating disc of the meter thereby corresponding to the watt-hours through the meter, such gate means receiving said signal from the watt transducer during said enabling time.

3. Apparatus as claimed in claim 2 including hand operable switch means adapted to activate the gate control means for a predetermined number of disc revolutions.

4. Apparatus as claimed in claim 3 including means to disable the gate control means after a predetermined number of disc revolution.

5. Apparatus as claimed in claim 4 wherein the gate means is adapted to receive signals from the gate control means thereby to enable the gate means for a predetermined number of pulses corresponding to the number of disc revolutions.

6. Apparatus as claimed in claim 5 including display means to indicate digitally the information as percentage accuracy of the watt hour meter.

7. Apparatus as claimed in any one of claims 1 to 6 wherein the phantom load means includes adjustable loading transformer means.

8. Apparatus as claimed in claim 7 including means for setting a frequency converter associated with the watt transducer thereby to adapt the watt transducer loading to correspond to a particular watt meter loading and operational characteristics.

9. Apparatus as claimed in claim 2, including reading means for counting a predetermined number of revolutions of the disc of the meter, said reading means including a light generating source and light receiving means adapted to be located on opposite sides of the disc, and the disc having an aperture through which light from the light generating source is adapted to pass when the aperture is aligned between the generating and receiving means, and the receiving means having conductor means to pass a received signal to the gate control means.

10. Apparatus as claimed in claim 9, wherein the reading means includes articulated arm means mounted on the adapter means, the generating source and receiving means being mounted on the arm means and being aligned axially relative to each other, the articulated arm means permitting movement of the generating source and receiving means relative to the disc to effect alignment with the aperture in the disc.

11. Apparatus as claimed in any one of claims 9 or 10, including hand operable switch means adapted to activate the gate control means for a predetermined number of disc revolutions.

12. Apparatus as claimed in claim 11, including means to disable the gate control means after a predetermined number of disc revolutions.

13. Apparatus as claimed in claim 12, wherein the watt transducer outputs a current signal, and including means for translating the current signal to a voltage, frequency converting means for converting the voltage to a representative frequency signal, the frequency converting means providing watt hour pulses proportional to the watt transducer output, and means for feeding such frequency output to the gate means.

14. Apparatus as claimed in claim 13, wherein the gate means is adapted to receive a signal from the gate control means thereby to enable the gate means for a predetermined number of pulses corresponding to the number of disc revolutions, the gate means thereafter being disabled.

* * * * *